US009368686B2

(12) United States Patent
Peng et al.

(10) Patent No.: US 9,368,686 B2
(45) Date of Patent: Jun. 14, 2016

(54) ARTICLE INCLUDING A LIGHT EMITTING GADOLINIUM-CONTAINING MATERIAL AND A PROCESS OF FORMING THE SAME

(71) Applicant: Saint-Gobain Ceramics & Plastics, Inc., Worcester, MA (US)

(72) Inventors: Xiaofeng Peng, Shanghai (CN); Qiwei Chen, Shanghai (CN)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 118 days.

(21) Appl. No.: 14/159,879

(22) Filed: Jan. 21, 2014

(65) Prior Publication Data

US 2014/0203319 A1    Jul. 24, 2014

Related U.S. Application Data

(60) Provisional application No. 61/761,025, filed on Feb. 5, 2013.

(30) Foreign Application Priority Data

Jan. 21, 2013  (CN) .......................... 2013 1 0025813

(51) Int. Cl.
*H01J 1/62*       (2006.01)
*H01L 33/30*     (2010.01)
(Continued)

(52) U.S. Cl.
CPC ................ *H01L 33/30* (2013.01); *C04B 35/01* (2013.01); *C04B 35/44* (2013.01);
(Continued)

(58) Field of Classification Search
CPC ........ H05B 33/14; H01L 33/50; C04B 35/44; C09K 11/77
USPC ..................................... 257/98; 313/501–503
See application file for complete search history.

(56) References Cited

U.S. PATENT DOCUMENTS 5,563,422 A * 10/1996 Nakamura ........ H01L 21/28575
257/103
6,479,420 B2   11/2002 Nakamura
(Continued)

FOREIGN PATENT DOCUMENTS

CN   1818012 A    8/2006
CN   101711327 A   5/2010
(Continued)

OTHER PUBLICATIONS

International Search Report for PCT/US2014/012297 dated May 8, 2014, 4 pgs.
(Continued)

*Primary Examiner* — David Vu
*Assistant Examiner* — Brandon Fox
(74) *Attorney, Agent, or Firm* — Abel Law Group, LLP (57) ABSTRACT

An article, such as a light emitting device, can include a first material and a second material, wherein the first material is capable of emitting first radiation having a first emission maximum at a first wavelength, and the second material is capable of emitting second radiation in response to capturing the first radiation. The second material can have a second emission maximum at a second wavelength within the visible light spectrum. In an embodiment, the second material can be different from the first material. In another embodiment, a difference between the first wavelength and the second wavelength can be at least approximately 70 nm. Additionally, the second material can include a luminescent material having a formula of $Gd_{3(x)}Y_{3(1-x)}Al_{5(y)}Ga_{5(1-y)}O_{12}$, where x is at least approximately 0.2 and no greater than approximately 0.99 and y is at least approximately 0.05 and no greater than approximately 0.99.

20 Claims, 6 Drawing Sheets

(51) Int. Cl.
*C09K 11/77* (2006.01)
*C04B 35/01* (2006.01)
*C04B 35/44* (2006.01)
*C04B 35/626* (2006.01)
*C04B 35/645* (2006.01)
*H01L 33/50* (2010.01)

(52) U.S. Cl.
CPC ...... *C04B 35/62685* (2013.01); *C04B 35/6455* (2013.01); *C09K 11/7774* (2013.01); *H01L 33/502* (2013.01); *H01L 33/505* (2013.01); C04B 2235/3217 (2013.01); C04B 2235/3224 (2013.01); C04B 2235/3225 (2013.01); C04B 2235/3229 (2013.01); C04B 2235/3284 (2013.01); C04B 2235/5409 (2013.01); C04B 2235/5436 (2013.01); C04B 2235/5445 (2013.01); C04B 2235/5481 (2013.01); C04B 2235/6581 (2013.01); C04B 2235/764 (2013.01); H01L 33/501 (2013.01); H01L 2224/48091 (2013.01); H01L 2224/48247 (2013.01); H01L 2224/48257 (2013.01); H01L 2224/73265 (2013.01); H01L 2933/0041 (2013.01)

(56) References Cited

U.S. PATENT DOCUMENTS

| | | | |
|---|---|---|---|
| 6,614,179 | B1 | 9/2003 | Shimizu et al. |
| 7,329,370 | B2 | 2/2008 | Kim et al. |
| 7,923,698 | B2 | 4/2011 | Stephan et al. |
| 8,339,025 | B2 * | 12/2012 | Nakamura ............. B82Y 30/00 313/484 |
| 2004/0135504 | A1 | 7/2004 | Tamaki et al. |
| 2005/0087724 | A1 | 4/2005 | Kim et al. |
| 2008/0054803 | A1 | 3/2008 | Zheng et al. |
| 2008/0187746 | A1 * | 8/2008 | De Graaf ............ C04B 35/6261 428/332 |
| 2010/0294939 | A1 | 11/2010 | Kuntz et al. |
| 2010/0301739 | A1 | 12/2010 | Nakamura et al. |
| 2011/0024635 | A1 | 2/2011 | Shah et al. |
| 2011/0044037 | A1 | 2/2011 | Scordino et al. |
| 2011/0133629 | A1 | 6/2011 | Sakata et al. |
| 2012/0018673 | A1 * | 1/2012 | Raukas ............... C09K 11/7774 252/301.4 R |
| 2012/0085972 | A1 * | 4/2012 | LaCourse .......... C09K 11/7769 252/301.4 F |
| 2013/0069007 | A1 * | 3/2013 | Miyagawa ......... C09K 11/7721 252/301.6 R |
| 2013/0258638 | A1 * | 10/2013 | Wang .................. H01L 33/505 362/84 |

FOREIGN PATENT DOCUMENTS

| | | |
|---|---|---|
| CN | 102099436 A | 6/2011 |
| CN | 102317409 A | 1/2012 |
| CN | 102449111 A | 5/2012 |
| JP | 2001-348273 A | 12/2001 |
| JP | 2012-528920 A | 11/2012 |
| KR | 10-2005-0038743 A | 4/2005 |

OTHER PUBLICATIONS

Cherepy, N. J., et al. "Comparative Gamma Spectroscopy with SrI2(Eu), GYGAG(Ce) and Bi-loaded Plastic Scintillators", IEEE Transactions on Nuclear Science, IEEE/NSS Proceedings, Nov. 22, 2010, 6 pages.

Cherepy, N. J., et al. "Scintillator Materials", Lawrence Livermore National Laboratory, U.S. Department of Energy, Feb. 10, 2011, 17 pages.

* cited by examiner

ARTICLE INCLUDING A LIGHT EMITTING GADOLINIUM-CONTAINING MATERIAL AND A PROCESS OF FORMING THE SAME

CROSS-REFERENCE TO RELATED APPLICATION

This application claims priority to Chinese application CN201310025813.1, entitled "Article Including A Light Emitting Gadolinium-Containing Material And A Process Of Forming The Same", by Peng et al. filed Jan. 21, 2013, which is assigned to the current assignee hereof and incorporated herein by reference in its entirety. This application further claims priority under 35 U.S.C. §119(e) to U.S. Patent Application No. 61/761,025 entitled "Article Including A Light Emitting Gadolinium-Containing Material And A Process Of Forming The Same," by Peng et al., filed Feb. 5, 2013, which is assigned to the current assignee hereof and incorporated herein by reference in its entirety.

FIELD OF THE DISCLOSURE

The present disclosure is directed to articles including light emitting gadolinium-containing materials, and processes of forming the same.

BACKGROUND

Light emitting devices can be used in a variety of applications. For example, light emitting devices can be used as a signal indicator (e.g., traffic lights, turn signals, etc.), to provide light to dark areas, to display text, to produce images, and the like. Certain light emitting devices can have limited lifespans, be inefficient in their use of electricity, or generate unwanted amounts of heat. In some cases, the heat generated by these light emitting device can cause components of the light emitting devices to degrade, which can decrease the useful life of such light emitting devices. Further improvements of light emitting devices are desired.

BRIEF DESCRIPTION OF THE DRAWINGS

Embodiments are illustrated by way of example and are not limited in the accompanying figures.

The use of the same reference symbols in different drawings indicates similar or identical items.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

In this specification, color may be expressed as a color space that is specified by a set of 1931 CIE (Commission Internationale de L'Eclairage) color space coordinates of x, y, and z.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or other features that are inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the embodiments of the disclosure. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this disclosure belongs. The materials, methods, and examples are illustrative only and not intended to be limiting. To the extent not described herein, many details regarding specific materials and processing acts are conventional and may be found in textbooks and other sources within the scintillation and light emitting device arts.

Figure 1:
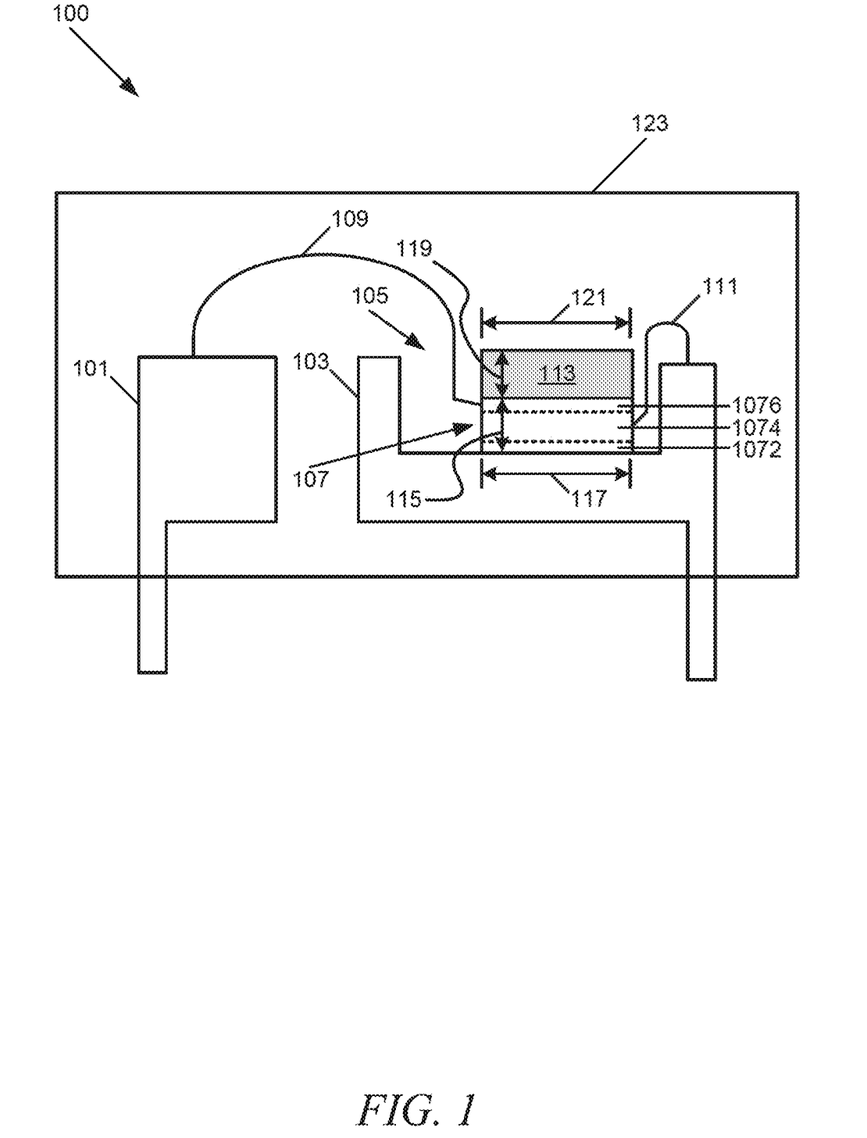
FIG. 1 includes a diagram illustrating a particular embodiment of a light emitting device.

FIG. 1 includes an illustration depicting a particular embodiment of a light emitting device 100. The light emitting device 100 can include a lead member 101 and a lead member 103. In an embodiment, the lead member 101 can be an anode, and the lead member 103 can be a cathode. In one embodiment, the lead member 101, the lead member 103, or both can include a metal, a metal alloy, or a combination thereof. In a particular embodiment, the lead member 101, the lead member 103, or both can include copper, brass, or silver. In another particular embodiment, the lead member 101, the lead member 103, or both can include an organic material, such as a plastic material. To illustrate the lead member 101, the lead member 103, or both can include a sulfonated polypyrrole, poly(3,4-ethylenedioxythiophene) ("PEDOT"), or polyamide.

The lead member 103 can include a recessed portion 105. A light-emitting member 107 resides within the recessed portion 105. In a particular embodiment, the member 107 can include a substrate 1072, a p-type region 1074 including a semiconductor material, and an n-type region 1076 including a semiconductor material. More details regarding materials within member 107 are discussed in more detail below. An electrode of the member 107 at the n-type region 1076 can be coupled to the lead member 101 via a connector 109, and the member 107 at the p-type region 1074 can be coupled to the lead member 103 via a connector 111. In a particular embodiment, the connector 109, the connector 111, or both can include a metal, a metal alloy, or a combination thereof. In an illustrative embodiment, the connector 109, the connector 111, or both can include a wire including copper, gold, or any combination thereof. In one embodiment, the connector 109, the connector 111, or both can be coupled to electrodes formed on the member 107. In a particular embodiment, the member 107 can be electrically connected to the lead members 101 and 103 via connectors 109 and 111, respectively.

In an embodiment, the radiation emitted by the member 107 can have a spectrum of wavelengths. In one embodiment, the spectrum of wavelengths can include an emission maximum at a particular wavelength. In a particular embodiment, the radiation from the member 107 can be substantially blue light. In an illustrative embodiment, the spectrum of wavelengths can include wavelengths within a range of approximately 350 nm to approximately 500 nm, or particularly approximately 420 nm to approximately 480 nm, or more particularly approximately 450 nm to approximately 475 nm. In another embodiment, the member 107 can emit ultraviolet radiation at wavelengths invisible to humans. In a particular embodiment, the member 107 can have an emission maximum in a range of approximately 200 nm to approximately 300 nm, and in a more particular embodiment, in a range of approximately 230 nm to approximately 270 nm.

A member 113 can capture radiation from the member 107 and emit different radiation as compared to radiation from the member 107. The member 113 can reside within the recessed portion 105. In an embodiment, the member 113 can be disposed adjacent to the member 107. In one embodiment, the member 113 can be coupled to the member 107, such as via an adhesive. Additionally, the member 113 can include one or more materials that are different from the materials of the member 107.

The radiation from the member 113 can have a spectrum of wavelengths that are different from the spectrum of wavelengths for radiation emitted by the member 107. In an embodiment, the spectrum of wavelengths emitted from the member 113 can include an emission maximum of a particular wavelength. In a particular embodiment, the light emitted from the member 113 can be substantially yellow light. In an illustrative embodiment, the spectrum of wavelengths can include wavelengths within a range of approximately 550 nm to approximately 600 nm or in particular, approximately 570 nm to approximately 590 nm. In another embodiment, a difference between the emission maximum corresponding to the member 107 and the emission maximum corresponding to the member 113 can be at least approximately 70 nm apart from each other.

In an embodiment, the member 107 can include a semiconductor device. In a particular embodiment, the embodiment, the semiconductor device can include a GaN layer. In a particular embodiment, the GaN layer can be formed on a substrate 1072. In an illustrative embodiment, the substrate 1072 can include sapphire, ZnO, SiC, Si, $Ga_2O_3$, AlN, GaN, or another suitable substrate.

In another embodiment, the GaN layer can include an additive. In an embodiment, the GaN layer can include at least approximately 100 atomic ppm of the additive, at least approximately 350 atomic ppm of the additive, at least approximately 600 atomic ppm of the additive, or at least approximately 1100 atomic ppm of the additive. Additionally, the GaN may include no greater than approximately 2 mol % of the additive, no greater than approximately 1 mol % of the additive, or no greater than approximately 0.5 mol % of the additive. In an illustrative embodiment, the additive can include In or Al.

Additionally, the semiconductor device can include an n-type region 1076 and a p-type region 1074. In one embodiment, the n-type region 1076 can have an n-type dopant that includes Si, Ge, Se, Te, C, or any combination thereof. In another particular embodiment, the p-type region 1074 can include a p-type dopant that includes Zn, Mg, Be, Ca, Sr, Ba, or any combination thereof.

In an embodiment, the member 113 can include a ceramic material. In one embodiment, the ceramic material can include Gd. In a particular embodiment, the ceramic material can include a luminescent material having a formula of $Gd_{3(x)}Y_{3(1-x)}Al_{5(y)}Ga_{5(1-y)}O_{12}$, wherein x is at least approximately 0.2 and no greater than approximately 0.99, and y is at least approximately 0.05 and no greater than approximately 0.99. The wavelength of the emitted light can be shifted to a shorter wavelength by substituting part of Al of the composition with Ga, which is represented by "y" in the formula, and the wavelength of the emitted light can be shifted to a longer wavelength by substituting part of Y of the composition with Gd, which is represented by "x" in the formula. In this way, the light color of emission can be changed continuously by changing the composition. For example, a degree of substitution with Gd below 20% results in a color of greater green component and less red component, and a degree of substitution with Gd above 60% results in increased red component but rapid decrease in luminance.

In one embodiment, x can be at least approximately 0.40, at least approximately 0.55, at least approximately 0.65, at least approximately 0.74, or at least approximately 0.77. In another embodiment, x may be no greater than approximately 0.95, no greater than approximately 0.88, no greater than approximately 0.84, no greater than approximately 0.81, or no greater than approximately 0.78. In an illustrative embodiment, x is within a range of approximately 0.70 to approximately 0.85. In an additional embodiment, y can be at least approximately 0.18, at least approximately 0.39, at least approximately 0.54, or at least approximately 0.72. In a further embodiment, y may be no greater than approximately 0.95, no greater than approximately 0.87, no greater than approximately 0.61, no greater than approximately 0.44, or no greater than approximately 0.23. In an additional illustrative embodiment, y can be within a range of approximately 0.4 to approximately 0.6.

In one embodiment, the member 113 can include an activator. In a particular embodiment, the activator can include Ce, Pr, Tb, Eu or another suitable element. In a particular embodiment, the member 113 can include at least approximately 100 atomic ppm Ce, at least approximately 200 atomic ppm Ce, at least approximately 400 atomic ppm Ce, or at least approximately 700 atomic ppm Ce. In another particular embodiment, the member 113 may include no greater than approximately 50,000 atomic ppm Ce, no greater than approximately 9000 atomic ppm Ce, no greater than approximately 1000 atomic ppm Ce, no greater than approximately 800 atomic ppm Ce, or no greater than approximately 500 atomic ppm Ce. In an illustrative embodiment, Ce of the member 113 can be substituted for part of Gd, part of Y, or both part of Gd and Y of the member 113. In another illustrative embodiment, the member 113 can include Ce within a range of approximately 400 ppm to approximately 800 ppm.

The member 113 can have a porosity that is no greater than approximately 1000 ppm, no greater than approximately 100 ppm, no greater than approximately 50 ppm, no greater than approximately 20 ppm, or no greater than approximately 10 ppm. Additionally, the member 113 can include a plurality of phases. In one embodiment, the plurality of phases can include a ceramic phase and at least one non-crystalline secondary phase. In a particular embodiment, the at least one secondary phase can include an amorphous phase. For example, the at least one secondary phase can include a phase having $SiO_2$. In an alternative embodiment, the member 113 can include a single phase.

The member 107 can have a thickness 115 and a width 117. The thickness 115 of the member 107 can be at least approximately 194 micrometers, at least approximately 248 micrometers, at least approximately 297 micrometers, at least approximately 331 micrometers, at least approximately 383 micrometers, or at least approximately 414 micrometers. In another embodiment, the thickness 115 of the member 107 may be no greater than approximately 1.62 mm, no greater than approximately 1.25 mm, no greater than approximately 0.93 mm, no greater than approximately 0.78 mm, no greater than approximately 0.61 mm, or no greater than approximately 0.52 mm. In an illustrative embodiment, the thickness 115 of the member 107 can be within a range of approximately 350 micrometers to approximately 950 micrometers.

Additionally, the width 117 of the member 107 can be at least approximately 0.85 mm, at least approximately 1.13 mm, at least approximately 1.52 mm, at least approximately 1.86 mm, or at least approximately 2.19 mm. In a further embodiment, the width 117 may be no greater than approximately 4.61 mm, no greater than approximately 4.27 mm, no greater than approximately 3.84 mm, no greater than approximately 3.38 mm, or no greater than approximately 2.77 mm. In an illustrative embodiment, the width 117 of the member 107 can be within a range of approximately 1.75 mm to approximately 3.5 mm.

In an embodiment, the member 113 can have a thickness 119 and a width 121. The thickness 119 of the member 113 can be at least approximately 122 micrometers, at least approximately 183 micrometers, at least approximately 231 micrometers, at least approximately 278 micrometers, at least approximately 344 micrometers, at least approximately 395 micrometers, or at least approximately 444 micrometers. In another embodiment, the thickness 119 of the member 107 may be no greater than approximately 2.91 mm, no greater than approximately 2.53 mm, no greater than approximately 2.18 mm, no greater than approximately 1.76 mm, no greater than approximately 1.32 mm, no greater than approximately 0.93 mm, no greater than approximately 0.71 mm, or no greater than approximately 0.56 mm. In an illustrative embodiment, the thickness 119 of the member 113 can be within a range of approximately 300 micrometers to approximately 900 micrometers.

Additionally, the width 121 of the member 113 can be at least approximately 0.62 mm, at least approximately 0.98 mm, at least approximately 1.41 mm, at least approximately 1.97 mm, or at least approximately 2.26 mm. In a further embodiment, the width 121 may be no greater than approximately 6.91 mm, no greater than approximately 6.15 mm, no greater than approximately 5.62 mm, no greater than approximately 5.28 mm, no greater than approximately 4.69 mm, no greater than approximately 4.04 mm, no greater than approximately 3.62 mm, no greater than approximately 3.37 mm, or no greater than approximately 2.81 mm. In an illustrative embodiment, the width 121 of the member 113 can be within a range of approximately 3.5 mm to about 5.5 mm.

Although, the illustrative embodiment of FIG. 1 illustrates the member 107 and the member 113 having similar dimensions, in other embodiment, the member 107 and the member 113 can have different dimensions. For example, the width 121 of the member 113 can be longer than the width 117 of the member 107. In a particular embodiment, the width 121 can span a width of the recessed portion 105. In another particular embodiment, the member 113 can be formed to encase the member 107. Additionally, in an embodiment, the light emitting device 100 can include a plurality of semiconductor devices, a plurality of luminescent members, or a combination thereof.

The light emitting device 100 can also include a casing 123. In an embodiment, the casing 123 can include a plastic material. In a particular embodiment, the casing 123 can include an epoxy.

In an illustrative embodiment, an electrical signal can be provided to the member 107. The member 107 can be configured to emit radiation in response to current passing through the member 107.

In an embodiment, the member 113 can include a luminescent material that is configured to emit light in response to capturing a portion of the radiation emitted by the member 107. In a particular embodiment, the member 107 and the member 113 can be matched such that a range of wavelengths over which the luminescent material of the member 113 captures radiation in emitting scintillating light overlaps with a spectrum of wavelengths of the light emitted by the member 107. In an embodiment, the radiation emitted by the member 107 and the light emitted by the member 113 can combine to produce light having a spectrum of wavelengths that is different from the spectrum of wavelengths of the light emitted by the member 107 and the spectrum of wavelengths of light emitted by the member 113. In a particular embodiment, the light produced by combining the light from the member 107 with the light of the member 113 is substantially white light. In an illustrative embodiment, the light produced when combining the light emitted by the member 107 with the light emitted by the member 113 may have an x coordinate in a range of approximately 0 to approximately 1, more particularly in a range of approximately 0.1 to 0.7, and even more particularly in a range of approximately 0.2 to 0.5. In another embodiment, a y coordinate may be in a range of approximately 0 to approximately 1, more particularly in a range of approximately 0.1 to approximately 0.5, and even more particularly in a range of approximately 0.15 to approximately 0.45.

Figure 2:
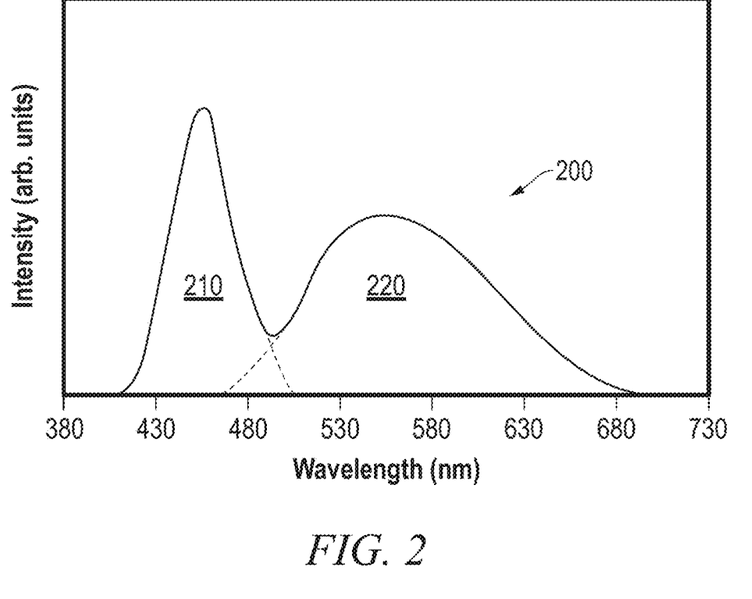
FIG. 2 includes a plot of radiation emitted by a light emitting device in accordance with an embodiment.

The light emitting device can have an emission spectrum 200 as illustrated in FIG. 2. The member 107 can have an emission spectrum similar to portion 210, and the member 113 can have an emission spectrum similar to portion 220. The combined portions 210 and 220 can produce substantially white light. As see in FIG. 2, the intensity of the emission spectrum 200 at approximately 450 nm is higher than the intensity of the emission spectrum 200 at approximately 570 nm. Thus, the emission spectrum 200 may produce "cool" white light, similar to some xenon headlights on automobiles. The emission spectrum 200 may produce light with an x coordinate in a range of approximately 0.2 to approximately 0.3, and a y coordinate in a range of approximately 0.15 to approximately 0.3.

As can be seen in FIG. 2, the emission spectra of the members 107 and 113 can overlap each other. In one embodiment, the range of wavelengths over which the luminescent material of the member 113 captures radiation include at least one peak wavelength of the light emitted by the member 107. In another embodiment, at least approximately 5% of the wavelengths over which the luminescent material of the member 113 captures radiation can overlap with the spectrum of wavelengths of the light emitted by the member 107, at least approximately 18% of the wavelengths over which the luminescent material of the member 113 captures radiation can overlap with the spectrum of wavelengths of the light emitted by the member 107, at least approximately 32% of the wavelengths over which the luminescent material of the member 113 captures radiation can overlap with the spectrum of wavelengths of the light emitted by the member 107, or at least approximately 46% of the wavelengths over which the luminescent material of the member 113 captures radiation can overlap with the spectrum of wavelengths of the light emitted by the member 107. Further, no greater than approximately 99% of the wavelengths over which the luminescent material of the member 113 captures radiation may overlap with the spectrum of wavelengths of the light emitted by the member 107, no greater than approximately 87% of the wavelengths over which the luminescent material of the member 113 captures radiation may overlap with the spectrum of wavelengths of the light emitted by the member 107, no greater than approximately 72% of the wavelengths over which the luminescent material of the member 113 captures radiation may overlap with the spectrum of wavelengths of the light emitted by the member 107, or no greater than approximately 56% of the wavelengths over which the luminescent material of the member 113 captures radiation may overlap with the spectrum of wavelengths of the light emitted by the member 107. In a particular embodiment, substantially all of the wavelengths over which the luminescent material of the member 113 captures radiation overlap with the spectrum of wavelengths of the light emitted by the member 107. In an alternative embodiment, a luminescent material of the member 113 can capture radiation by a radiation source that is separate from the member 107. In an additional alternative embodiment, the luminescent material of the member 113 can capture radiation by both a radiation source that is separate from the member 107 and by the member 107.

Figure 3:
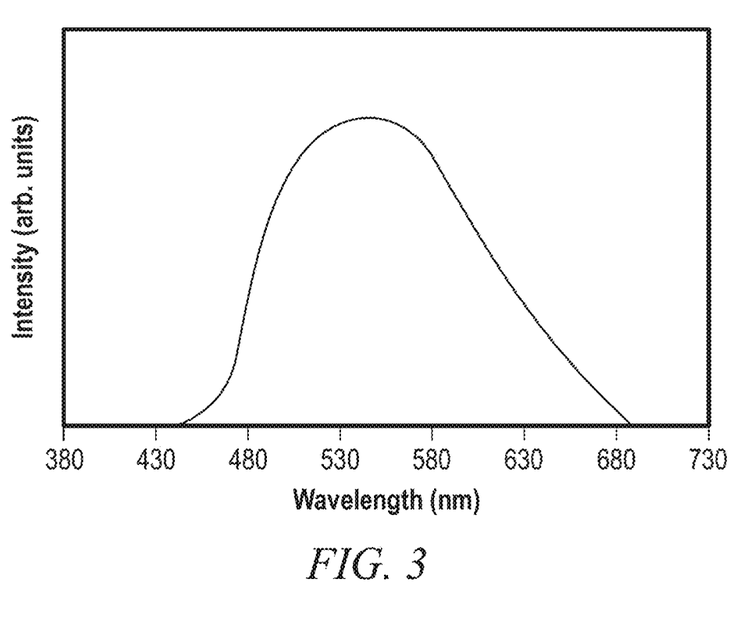
FIG. 3 includes a plot of radiation emitted by a luminescent member in accordance with a particular embodiment.

In another embodiment, the member 107 can emit radiation outside the visible light spectrum. For example, the member 107 can emit ultraviolet radiation. In a particular embodiment, the member 107 can emit radiation having an emission maximum in a range of approximately 200 nm to approximately 300 nm, and more particularly in a range of approximately 230 nm to approximately 270 nm. The member 113 can have an emission spectrum as illustrated in FIG. 3. Such an emission spectrum can be perceived by humans as being yellow-green light. When such light passes through a diffuser, the emission spectrum can be broadened, such as illustrated with the emission spectrum in FIG. 4. The diffuser can be achieved by having a relatively rough surface along an exposed surface (uppermost surface in FIG. 1) of member 113. Such a relatively rough surface may be obtained by lapping or abrading the surface of the member 113. Alternatively, a window with a frosted or roughened surface may be used. Thus, the window may receive the emission spectrum of FIG. 3 and emit the emission spectrum of FIG. 4.

Figure 4:
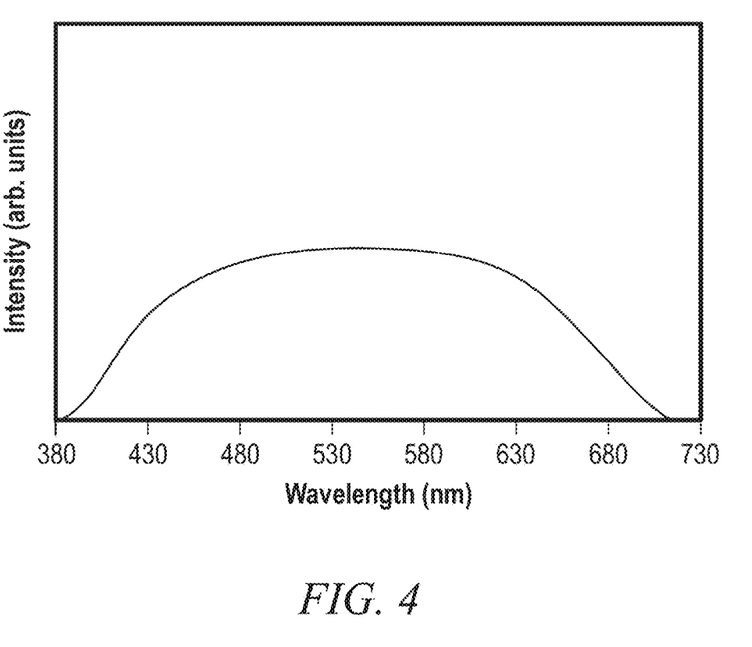
FIG. 4 includes a plot of radiation emitted by a diffuser that broadens the emission spectrum from the luminescent member of FIG. 3.

The emission spectrum in FIG. 4 can produce substantially white light. Thus, the emission spectrum may produce white light similar to an incandescent table lamp. The emission spectrum may produce having light with an x coordinate in a range of approximately 0.4 to approximately 0.5, and a y coordinate in a range of approximately 0.3 to approximately 0.45. If "warm" light is desired, the Al content can be relatively higher to produce a stronger red component in the emission spectrum.

In an embodiment, the light emitting device 100 has advantages over conventional LEDs. For example, the composition of the luminescent material of the member 113 can be adjusted to tailor the light emission from the luminescent material to control the color of the light produced by the light emitting device 100. To illustrate, an emission maximum of the light emitted by the member 113 can be shifted to a shorter wavelength by substituting a portion of the Al content of the member 113 with Ga. In another situation, an emission maximum of the light emitted by the member 113 can be shifted to a longer wavelength by substituting a portion of the Y content of the member 113 with Gd. In a particular illustrative example, an emission maximum of the light emitted by the member 113 can be adjusted to be in a range of approximately 530 nm to approximately 590 nm based on the composition of the member 113. Furthermore, thermal degradation of the light emitting device 100 can be reduced due to the heat resistance of the ceramic material of the member 113. Accordingly, the luminous intensity and consistency of the color of the light emitted by the light emitting device 100 can be maintained over a longer period of time than conventional LEDs.

Figure 5:
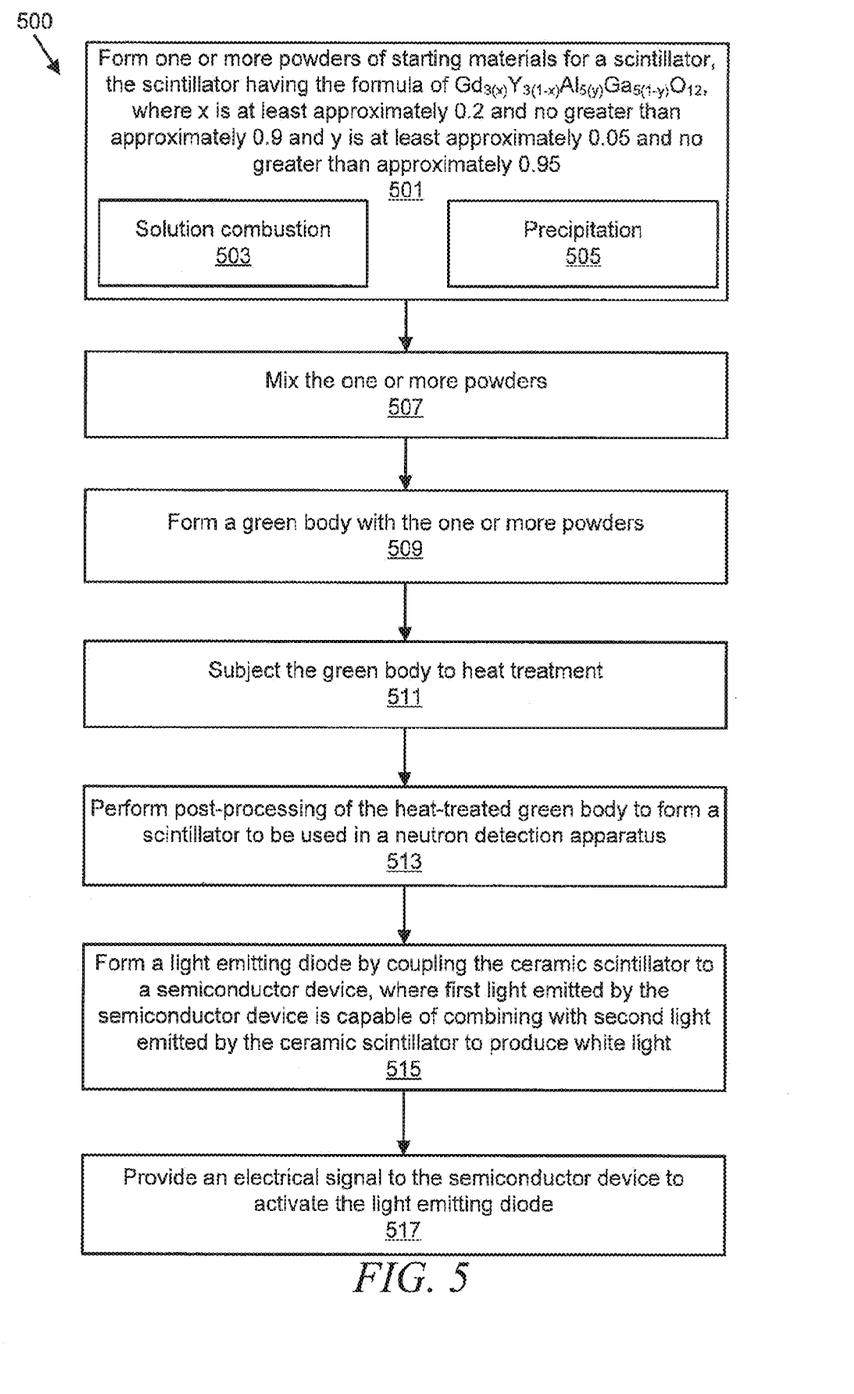
FIG. 5 includes a flow diagram depicting a process to make a light emitting device according to an embodiment.
Figure 6:
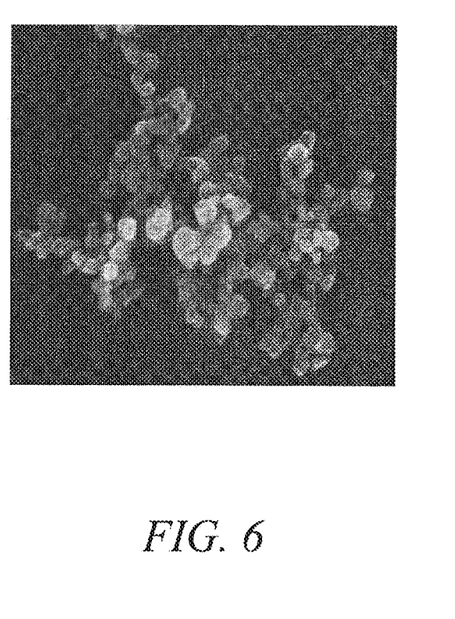
FIG. 6 includes a scanning electron microscope (SEM) image of a $(Gd_{0.5}Y_{0.5})_2O_3$:Ce powder.
Figure 7:
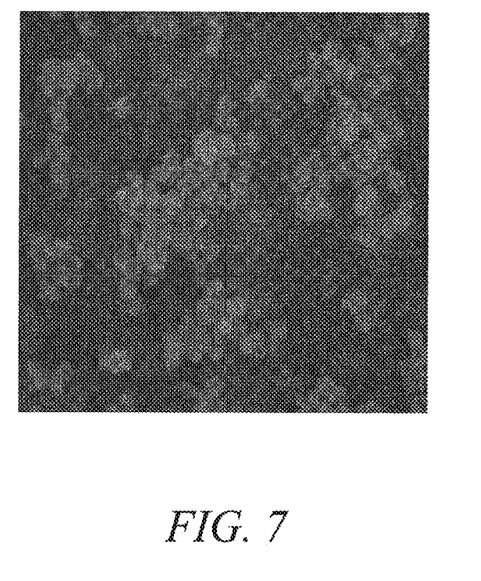
FIG. 7 includes an SEM image of an $Al_2O_3$ powder.
Figure 8:
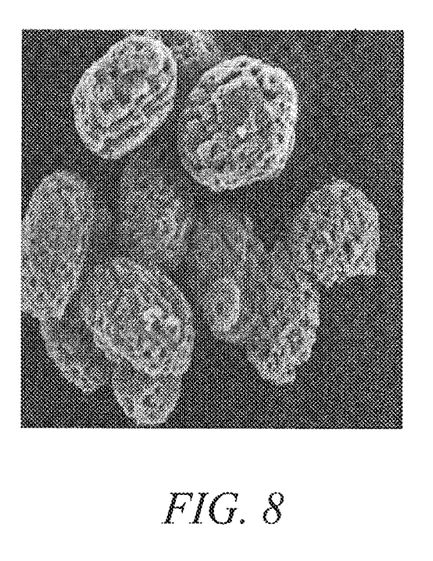
FIG. 8 includes an SEM image of a $Ga_2O_3$ powder precipitated using an aqueous ammonia solution.
Figure 9:
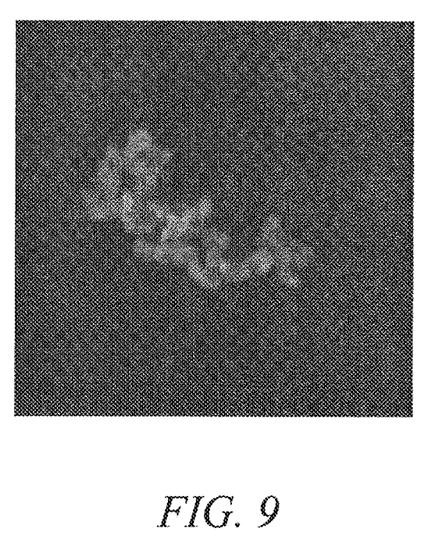
FIG. 9 includes an SEM image of a $Ga_2O_3$ powder precipitated using an ammonium hydrogen carbonate solution.

FIG. 5 includes a flow diagram illustrating a process 500 to make a luminescent member of a light emitting device according to an embodiment. For example, the member 113 can include the luminescent material prepared as described herein. The luminescent material can have the formula $Gd_{3(x)}Y_{3(1-x)}Al_{5(y)}Ga_{5(1-y)}O_{12}$, wherein x and y can have any of the values are previously described. In an embodiment, x is at least approximately 0.2 and no greater than approximately 0.99, and y is at least approximately 0.05 and no greater than approximately 0.99. The luminescent material can be capable of emitting light in response to capturing radiation from a source. In one embodiment, the source can be a semiconductor device, such as previously described with respect to the member, coupled to the luminescent material.

At 501, the process 500 can include forming one or more powders of starting materials. At 503, a powder of the starting materials can be produced through a solution combustion process. In a particular embodiment, a powder corresponding to the formula $Gd_{3(x)}Y_{3(1-x)}Al_{5(y)}Ga_{5(1-y)}O_{12}$, can be produced via a solution combustion process. In an additional embodiment, a $Ga_2O_3$ powder can be produced via a solution combustion process. The solution combustion process can include an exothermic reaction of a mixture that includes one or more oxidizers, an organic fuel, and water. In an embodiment, the one or more oxidizers can include metal nitrates, ammonium nitrate, ammonium perchlorate, or any combination thereof. The fuel can include urea ($CH_4N_2O$), carbohydrazide ($CH_6N_4$), glycine ($C_2H_5NO_2$), or any combination thereof. In a particular embodiment, the solution combustion reaction may be initiated at a temperature no greater than approximately 500° C. A muffle furnace or a hot plate can be used to heat the mixture to the combustion reaction initiation temperature. The mixture can be heated for at least approximately 15 seconds, at least approximately 1 minute, or at least approximately 3 minutes before the combustion reaction takes place. In another embodiment, the mixture may be heated for no greater than approximately 15 minutes, no greater than approximately 7 minutes, no greater than approximately 5 minutes or no greater than approximately 2 minutes before the solution combustion reaction occurs.

At 505, powders of the starting materials can be produced via a precipitation process. For example, one or more $Ga_2O_3$ powders can be formed from a precipitation process. In one embodiment, a $Ga_2O_3$ powder can be formed by precipitation using an ammonia water solution. In another embodiment, a $Ga_2O_3$ powder can be formed by precipitation using an ammonium hydrogen carbonate solution. In a further embodiment, a (Gd,Y)$_2$O$_3$:Ce powder can be produced via a co-precipitation process.

The starting materials can also include one or more additional powders, such as an Al$_2$O$_3$ powder. In addition, the starting materials include an activator, such as Ce. In another embodiment, the starting material can include a sintering aid (e.g., LiF, GdF$_3$, tetraethyl orthosilicate), another additive, or any combination thereof.

In an embodiment, particles of the powders of the starting materials can have a D10 value of at least approximately 0.065 micrometers, at least approximately 0.140 micrometers, at least approximately 0.225 micrometers, or at least approximately 0.310 micrometers. In another embodiment, the D10 value for particles of the powders of the starting materials may be no greater than approximately 0.600 micrometers, no greater than approximately 0.460 micrometers, or no greater than approximately 0.380 micrometers. In an illustrative embodiment, the D10 value for particles of the powders of the starting materials can be within a range of approximately 0.075 micrometers to approximately 0.500 micrometers. In one particular illustrative embodiment, the D10 value for a gadolinium and yttria containing oxide powder can be within a range of approximately 0.07 micrometers to approximately 0.09 micrometers, and the D10 value for an Al$_2$O$_3$ powder can be within a range of approximately 0.09 micrometers to approximately 0.125 micrometers. In another particular illustrative embodiment, the D10 value for a Ga$_2$O$_3$ powder formed via ammonia water precipitation can be within a range of approximately 0.41 micrometers to approximately 0.55 micrometers, and a D10 value for a Ga$_2$O$_3$ powder via an ammonium hydrogen carbonate precipitation process can be within a range of approximately 0.13 micrometers to approximately 0.155 micrometers.

Additionally, the particles of the powders of the starting materials can have a D50 value of at least approximately 0.10 micrometers, at least approximately 0.55 micrometers, at least approximately 0.90 micrometers, or at least approximately 1.30 micrometers. The D50 value for the particles of the powders of the starting materials may also be no greater than approximately 1.73 micrometers, no greater than approximately 1.40 micrometers, or no greater than approximately 1.15 micrometers. In an illustrative embodiment, the D50 value for particles of the powders of the starting materials can be within a range of approximately 0.10 micrometers to approximately 1.60 micrometers. In one particular illustrative embodiment, the D50 value for a gadolinium and yttria containing oxide powder can be within a range of approximately 0.10 micrometers to approximately 0.22 micrometers, and the D50 value for an Al$_2$O$_3$ powder can be within a range of approximately 0.10 micrometers to approximately 0.23 micrometers. In another particular illustrative embodiment, the D50 value for a Ga$_2$O$_3$ powder formed via ammonia water precipitation can be within a range of approximately 0.70 micrometers to approximately 0.95 micrometers, and a D50 value for a Ga$_2$O$_3$ powder via an ammonium hydrogen carbonate precipitation process can be within a range of approximately 1.45 micrometers to approximately 1.65 micrometers.

In a further embodiment, the particles of the powders of the starting materials can have a D90 value of at least approximately 0.180 micrometers, at least approximately 0.95 micrometers, at least approximately 1.40 micrometers, or at least approximately 2.90 micrometers. The D90 value for the particles of the powders of the starting materials may also be no greater than approximately 4.80 micrometers, no greater than approximately 3.90 micrometers, or no greater than approximately 3.10 micrometers. In an illustrative embodiment, the D90 value for particles of the powders of the starting materials can be within a range of approximately 0.2 micrometers to approximately 0.4.6 micrometers. In one particular illustrative embodiment, the D90 value for a gadolinium and yttria containing oxide powder can be within a range of approximately 1.10 micrometers to approximately 1.65 micrometers, and the D90 value for an Al$_2$O$_3$ powder can be within a range of approximately 0.15 micrometers to approximately 0.32 micrometers. In another particular illustrative embodiment, the D90 value for a Ga$_2$O$_3$ powder formed via ammonia water precipitation can be within a range of approximately 1.1 micrometers to approximately 1.6 micrometers, and a D90 value for a Ga$_2$O$_3$ powder via an ammonium hydrogen carbonate precipitation process can be within a range of approximately 3.75 micrometers to approximately 5.10 micrometers.

In an additional embodiment, the specific surface area for particles of the powders of the starting materials can be at least approximately 7.0 m$^2$/g, at least approximately 13.1 m$^2$/g, or at least approximately 18.4 m$^2$/g. The specific surface area for the particles of the powders of the starting materials may also be no greater than approximately 21.9 m$^2$/g, no greater than approximately 19.4 m$^2$/g, or no greater than approximately 17.7 m$^2$/g. In an illustrative embodiment, the specific surface area for particles of the powders of the starting materials can be within a range of approximately 8.0 m$^2$/g to approximately 21.5 m$^2$/g. In one particular illustrative embodiment, the specific surface area for a gadolinium and yttria containing oxide powder can be within a range of approximately 15.5 m2/g to approximately 21.3 m2/g, and the specific surface area for an Al$_2$O$_3$ powder can be within a range of approximately 18.5 m$^2$/g to approximately 23.8 m$^2$/g. In another particular illustrative embodiment, the specific surface area for a Ga$_2$O$_3$ powder formed via ammonia water precipitation can be within a range of approximately 7.75 m$^2$/g to approximately 9.4 m$^2$/g micrometers, and a specific surface area for a Ga$_2$O$_3$ powder via an ammonium hydrogen carbonate precipitation process can be within a range of approximately 17.5 m$^2$/g to approximately 24.2 m$^2$/g.

At 507, the starting materials can be mixed. In a specific embodiment, mixing can be performed as via ball milling.

At 509, the mixture can be formed into a green body, such as via cold die pressing, cold isostatic pressing, or a combination thereof. During cold isostatic pressing, the mixture can be pressed at pressures within a range of approximately 150 MPa to approximately 300 MPa.

At 511, the green body can be subjected to one or more heat treatments, such as sintering, hot isostatic pressing, or a combination thereof. In one embodiment, the green body can undergo a vacuum sintering process at a temperature within a range of approximately 1700° C. to approximately 1750° C. for a duration within a range of approximately 4 hours to approximately 12 hours. The vacuum sintering can take place at pressures within a range of approximately 10$^{-4}$ Pa to approximately 10$^{-3}$ Pa. In another embodiment, the green body can be subjected to hot isostatic pressing at a temperature within a range of approximately 1300° C. to approximately 1500° C. at a pressure within a range of approximately 50 MPa to approximately 100 MPa.

At 513, after heat treatment, the green body can undergo one or more post-processing operations, such as drying, curing, shaping, or any combination thereof, to form a luminescent member to be used in a light emitting device, such as the light emitting device 100 of FIG. 1.

At 515, the method 500 includes forming a light emitting device by coupling the luminescent member to a semiconductor device. In an embodiment, light emitted by the luminescent member can be capable of being combined with light emitted by the semiconductor device to produce white light. At 517, an electrical signal is provided to the semiconductor device to active the light emitting diode. In a particular embodiment, the light emitting device is activated due to the semiconductor device emitting light in response to receiving the electrical signal and the luminescent member emitting light in response to receiving the light from the semiconductor device.

Many different aspects and embodiments are possible. Some of those aspects and embodiments are described herein. After reading this specification, skilled artisans will appreciate that those aspects and embodiments are only illustrative and do not limit the scope of the present invention. Additionally, those skilled in the art will understand that some embodiments that include analog circuits can be similarly implemented using digital circuits, and vice versa. Embodiments may be in accordance with any one or more of the items as listed below.

Item 1. An article including a light emitting device can include a first material capable of emitting first radiation having a first emission maximum at a first wavelength, and a second material capable of emitting second radiation in response to capturing the first radiation, the second radiation having a second emission maximum at a second wavelength within a visible light spectrum, wherein the second material is different from the first material, a difference between the first wavelength and the second wavelength is at least approximately 70 nm, and the second material comprises a luminescent material having a formula of $Gd_{3(x)}Y_{3(1-x)}Al_{5(y)}Ga_{5(1-y)}O_{12}$, wherein x is at least approximately 0.2 and no greater than approximately 0.99 and y is at least approximately 0.05 and no greater than approximately 0.99.

Item 2. A process can include forming one or more powders of starting materials; mixing the one or more starting materials to form a mixture; forming the mixture into a green body; heat treating the green body to form a second material that includes a ceramic luminescent member having a formula of $Gd_{3(x)}Y_{3(1-x)}Al_{5(y)}Ga_{5(1-y)}O_{12}$, wherein x is at least approximately 0.2 and no greater than approximately 0.99 and y is at least approximately 0.05 and no greater than approximately 0.99; and forming a light emitting device by coupling the second material to a first material that includes a semiconductor material. The first material can be capable of emitting first radiation having a first emission maximum at a first wavelength; and the second material can be capable of emitting second radiation in response to capturing the first radiation, the second radiation having a second emission maximum at a second wavelength within a visible light spectrum.

Item 3. The process of Item 2, wherein the one or more powders of starting materials are formed via a solution combustion process or a precipitation process.

Item 4. The process of Item 2 or 3, wherein particles of the one or more powders of the starting materials have a specific surface area of at least approximately 7.0 m²/g, at least approximately 13.1 m²/g, or at least approximately 18.4 m²/g; or wherein particles of the one or more powders of the starting materials have a specific surface area of no greater than approximately 21.9 m²/g, no greater than approximately 19.4 m²/g, or no greater than approximately 17.7 m²/g.

Item 5. The process of any one of Items 2 to 4, further comprising forming lead members coupled to the semiconductor material.

Item 6. The article or process of any one of Items 1 to 5, wherein the first material is configured to emit the first radiation in response to current passing through the first material.

Item 7. The article or process of any one of Items 1 to 6, wherein the second material is disposed adjacent to the first material.

Item 8. The article or process of any one of Items 1 to 7, wherein the first material includes a semiconductor material.

Item 9. The article or process of any one of Items 1 to 8, wherein the second material has a porosity that is no greater than approximately 1000 ppm, no greater than approximately 100 ppm, no greater than approximately 50 ppm, no greater than approximately 20 ppm, or no greater than approximately 10 ppm.

Item 10. The article or process of any one of Items 1 to 9, wherein the first material includes a GaN layer.

Item 11. The article or process of any one of Items 1 to 10, wherein the GaN layer further includes In or Al.

Item 12. The article or process of any one of Items 1 to 11, wherein the first material includes an n-type region and a p-type region, wherein, the n-type region is coupled to a lead member, and the p-type region is coupled to a different lead member.

Item 13. The article or process of Item 12, wherein the n-type region comprises an n-type dopant that includes Si, Ge, Se, Te, C, or any combination thereof.

Item 14. The article or process of Item 12 or 13, wherein the p-type region comprises a p-type dopant that includes Zn, Mg, Be, Ca, Sr, Ba, or any combination thereof.

Item 15. The article or process of any one of Items 1 to 14, wherein x is at least approximately 0.40, at least approximately 0.55, at least approximately 0.65, at least approximately 0.74, or at least approximately 0.77; or wherein x is no greater than approximately 0.88, no greater than approximately 0.84, no greater than approximately 0.81, or no greater than approximately 0.78.

Item 16. The article or process of any one of Items 1 to 14, wherein x is within a range of approximately 0.74 to approximately 0.84.

Item 17. The article or process of any one of Items 1 to 16, wherein y is at least approximately 0.18, at least approximately 0.39, at least approximately 0.54, or at least approximately 0.72; or wherein y is no greater than approximately 0.87, no greater than approximately 0.61, no greater than approximately 0.44, or no greater than approximately 0.23.

Item 18. The article or process of any one of Items 1 to 16, wherein y is within a range of approximately 0.39 to approximately 0.61.

Item 19. The article or process of any one of Items 1 to 18, wherein the second material includes at least approximately 100 atomic ppm Ce, at least approximately 200 atomic ppm Ce, at least approximately 400 atomic ppm Ce, or at least approximately 700 atomic ppm Ce; or wherein the second material includes no greater than 50,000 atomic ppm Ce, no greater than approximately 9000 atomic ppm, Ce, no greater than approximately 1000 atomic ppm Ce, no greater than approximately 800 atomic ppm Ce, or no greater than approximately 500 atomic ppm Ce.

Item 20. The article or process of any one of Items 1 to 18, wherein the second material includes Ce within a range of approximately 400 ppm to approximately 800 ppm.

Item 21. The article or process of Item 19 or 20, wherein Ce is substituted for part of Gd, part of Y, or both part of Gd and Y.

Item 22. The article or process of any one of Items 1 to 21, wherein the light emitting device further comprises a diffuser that is configured to diffuse at least the second radiation to produce third radiation after passing through the diffuser, wherein the third radiation is different from the at least the second radiation.

Item 23. The article or process of any one of Items 1 to 21, wherein the second material has a roughened surface that is capable of producing third radiation from at least the second radiation, wherein the third radiation is different from the at least second radiation.

Item 24. The article or process of any one of Items 1 to 23, wherein the third radiation has an x coordinate in a range of approximately 0 to approximately 1, more particularly in a range of approximately 0.1 to 0.7, and even more particularly in a range of approximately 0.2 to 0.5.

Item 25. The article or process of any one of Items 1 to 23, wherein the third radiation has a y coordinate in a range of approximately 0 to approximately 1, more particularly in a range of approximately 0.1 to approximately 0.5, and even more particularly in a range of approximately 0.15 to approximately 0.45.

Item 26. The article or process of any one of Items 1 to 25, wherein the third radiation is substantially white radiation.

Item 27. The article or process of any one of Items 1 to 26, wherein the second radiation is substantially yellow radiation.

Item 28. The article or process of any one of Items 1 to 26, wherein the second wavelength is within a range of wavelengths between approximately 550 nm and approximately 600 nm or approximately 570 nm and 590 nm.

Item 29. The article or process of any one of Items 1 to 28, wherein the first radiation is substantially blue light.

Item 30. The article or process of any one of Items 1 to 28, wherein the first wavelength is within a range of wavelengths between approximately 350 nm and approximately 500 nm, approximately 420 nm and approximately 480 nm, or approximately 450 nm and approximately 475 nm.

Item 31. The article or process of any one of Items 1 to 30, wherein the light emitting device is configured to combine the first radiation and the second radiation to produce a third radiation having an emission within the visible light spectrum that is different from the second radiation.

Item 32. The article or process of any one of Items 1 to 26, wherein the first radiation has an emission maximum within an ultraviolet spectrum.

Item 33. The article or process of any one of Items 1 to 26, wherein the first radiation has an emission maximum in a range of approximately 200 nm to approximately 300 nm.

EXAMPLES

The concepts described herein will be further described in the following examples, which do not limit the scope of the invention described in the claims. Numerical values in this Examples section may be approximated or rounded off for convenience.

Luminescent members are prepared using the processes described previously. In particular, luminescent members are prepared using powders of $(Gd_{0.5}Y_{0.5})_2O_3$:Ce, $Al_2O_3$, and $Ga_2O_3$. Characteristics of the particles of the powders are included in Table 1. The $(Gd_{0.5}Y_{0.5})_2O_3$:Ce and $Ga_2O_3$ powders are prepared by a precipitation process. Specifically, the $Ga_2O_3$ AW powder is produced from precipitating an ammonia water (AW) solution into a solution of $Ga(NO_3)_3$ and $GaCl_3$, and the $Ga_2O_3$ (AHC) powder is formed by precipitating a solution of $Ga(NO_3)_3$ and $GaCl_3$ into an ammonium hydrogen carbonate solution. The $Ga(NO_3)_3$ solution and the $GaCl_3$ solution are produced from dissolving metal Ga in aqua regia. The aqua regia is a mixture of nitric acid and hydrochloric acid. The $Ga_2O_3$ (AW) and the $Ga_2O_3$ (AHC) powders are calcined for a duration within a range of approximately 1.8 hours and approximately 2.2 hours at a temperature within a range of approximately 930° C. to approximately 970° C.

The $(Gd_{0.5}Y_{0.5})_2O_3$:Ce powder is formed via a co-precipitation process. The co-precipitation process includes combining an amount of a precipitant, such as an ammonia water solution or an ammonium hydrogen carbonate solution, with a mixture of $Y(NO_3)_3$, $Gd(NO_3)_3$, and $Ce(NO_3)_3$ to form a precipitate precursor solution. The precipitate precursor solution is then filtered to form a wet cake and subsequently dried. The $(Gd_{0.5}Y_{0.5})_2O_3$:Ce wet cake is calcined for a duration within a range of approximately 1.8 hours and approximately 2.2 hours at a temperature within a range of approximately 930° C. to approximately 970° C.

TABLE 1

| Powder | D10 (μm) | D50 (μm) | D90 (μm) | Specific Surface Area (m²/g) |
|---|---|---|---|---|
| $(Gd_{0.5}Y_{0.5})_2O_3$ | 0.079 | 0.14 | 1.36 | 18.57 |
| $Al_2O_3$ | 0.113 | 0.15 | 0.202 | 21.0 |
| $Ga_2O_3$ (AW) | 0.487 | 0.825 | 1.365 | 8.58 |
| $Ga_2O_3$ (AHC) | 0.144 | 1.54 | 4.54 | 20.28 |

FIGS. 6 to 9 include scanning electron microscope (SEM) images of powders used to form luminescent members as described in embodiments herein. In particular, FIG. 6 includes a scanning electron microscope (SEM) image of a $(Gd_{0.5}Y_{0.5})_2O_3$ powder, FIG. 7 includes an SEM image of an $Al_2O_3$ powder, FIG. 8 includes an SEM image of a $Ga_2O_3$ (AW) powder, and FIG. 9 includes an SEM image of a $Ga_2O_3$ (AHC) powder.

The powders are weighed in amounts to form a luminescent material having a particular composition and the powders are then mixed via planetary milling. Subsequently, the mixture of powders is formed into a green body using a cold isostatic pressing process at pressures within a range of approximately 150 MPa to approximately 300 MPa. After cold isostatic pressing, some samples are formed through a vacuum sintering process at a temperature within a range of approximately 1700° C. to approximately 1750° C. for a duration within a range of approximately 4 hours to approximately 12 hours and at pressures within a range of approximately $10^{-4}$ Pa to approximately $10^{-3}$ Pa. Other samples are formed through hot isostatic pressing at a temperature within a range of approximately 1300° C. to approximately 1500° C. at a pressure within a range of approximately 50 MPa to approximately 100 MPa.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An article including a light emitting device comprising:
   a first material capable of emitting first radiation having a first emission maximum at a first wavelength; and
   a second material capable of emitting second radiation in response to capturing the first radiation, the second radiation having a second emission maximum at a second wavelength within a visible light spectrum, wherein:
      the second material is different from the first material;
      a difference between the first wavelength and the second wavelength is at least approximately 70 nm; and
      the second material comprises a luminescent material having a formula of $Gd_{3(x)}Y_{3(1-x)}Al_{5(y)}Ga_{5(1-y)}O_{12}$, wherein x is at least approximately 0.2 and no greater than approximately 0.99 and y is at least approximately 0.05 and no greater than approximately 0.99, wherein the second material has a porosity that is no greater that approximately 1000 ppm.

2. The article of claim 1, wherein the first material is configured to emit the first radiation in response to current passing through the first material.

3. The article of claim 1, wherein the first material includes a semiconductor material.

4. The article of claim 1, wherein the first material includes an n-type region and a p-type region, wherein the n-type region is coupled to a lead member, and the p-type region is coupled to a different lead member.

5. The article of claim 4, wherein the n-type region comprises an n-type dopant that includes Si, Ge, Se, Te, C, or any combination thereof.

6. The article of claim 4, wherein the p-type region comprises a p-type dopant that includes Zn, Mg, Be, Ca, Sr, Ba, or any combination thereof.

7. The article of claim 1, wherein the second material includes at least approximately 100 atomic ppm Ce; or wherein the second material includes no greater than 50,000 atomic ppm Ce.

8. The article of claim 1, wherein the second material has a porosity that is no greater than approximately 100 ppm.

9. The article of claim 1, wherein x is in a range of from at least approximately 0.40 to no greater than approximately 0.88; or wherein y is in a range of from at least approximately 0.18 to no greater than approximately 0.87.

10. The article of claim 1, wherein the second material has a roughened surface that is capable of producing third radiation from at least the second radiation, wherein the third radiation is different from the at least second radiation.

11. The article of claim 1, wherein the light emitting device further comprises a diffuser that is configured to diffuse at least the second radiation to produce third radiation after passing through the diffuser, wherein the third radiation is different from the at least the second radiation.

12. A process comprising:
   forming one or more powders of starting materials;
   mixing the one or more starting materials to form a mixture;
   forming the mixture into a green body;
   heat treating the green body to form a second material that includes a ceramic luminescent member having a formula of $Gd_{3(x)}Y_{3(1-x)}Al_{5(y)}Ga_{5(1-y)}O_{12}$, wherein x is at least approximately 0.2 and no greater than approximately 0.99 and y is at least approximately 0.05 and no greater than approximately 0.99; and
   forming a light emitting device by coupling the second material to a first material that includes a semiconductor material, wherein:
      the first material is capable of emitting first radiation having a first emission maximum at a first wavelength; and
      the second material is capable of emitting second radiation in response to capturing the first radiation, the second radiation having a second emission maximum at a second wavelength within a visible light spectrum, wherein the second material has a porosity that is no greater than approximately 1000 ppm.

13. The process of claim 12, wherein particles of the one or more powders of the starting materials have a specific surface area in a range of from at least approximately 7.0 m²/g to no greater than approximately 21.9 m²/g.

14. The process of claim 12, further comprising forming lead members coupled to the semiconductor material.

15. The process of claim 12, wherein the first material is configured to emit the first radiation in response to current passing through the first material.

16. The process of claim 12, wherein the second material is disposed adjacent to the first material.

17. The process of claim 12, wherein particles of the one or more powders of the starting materials have:
   a D10 value in a range of from at least approximately 0.0065 micrometers to approximately 0.0060 micrometers;
   a D50 value in a range of from at least approximately 0.10 micrometers to approximately 1.73 micrometers;
   a D90 value in a range of from at least approximately 0.18 micrometers to not greater than approximately 4.80 micrometers; or
   any combination thereof.

18. The process of claim 12, wherein the first material includes a GaN layer.

19. The process of claim 12, wherein x is from at least approximately 0.40 to no greater than approximately 0.88; or wherein y is from at least approximately 0.18 to no greater than approximately 0.87.

20. The process of claim 12, wherein the second material includes at least approximately 100 atomic ppm Ce; or wherein the second material includes no greater than approximately 500 atomic ppm Ce.

* * * * *